United States Patent
Chang et al.

(10) Patent No.: US 7,671,831 B2
(45) Date of Patent: Mar. 2, 2010

(54) OUTPUT BUFFER WITH IMPROVED OUTPUT DEVIATION AND SOURCE DRIVER FOR FLAT PANEL DISPLAY HAVING THE OUTPUT BUFFER

(75) Inventors: Dong-ryul Chang, Suwon-si (KR); Soo-cheol Lee, Seoul (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 533 days.

(21) Appl. No.: 11/619,709

(22) Filed: Jan. 4, 2007

(65) Prior Publication Data

US 2007/0164974 A1 Jul. 19, 2007

(30) Foreign Application Priority Data

Jan. 13, 2006 (KR) .................... 10-2006-0003962

(51) Int. Cl.
G09G 3/36 (2006.01)
(52) U.S. Cl. ........................... 345/100; 345/98
(58) Field of Classification Search ........... 345/83–100, 345/204
See application file for complete search history.

(56) References Cited

U.S. PATENT DOCUMENTS

| | | | | |
|---|---|---|---|---|
| 6,731,263 B2* | 5/2004 | Goto et al. | ..................... | 345/98 |
| 6,924,690 B2 | 8/2005 | Nakamura | | |
| 6,970,152 B1* | 11/2005 | Bell et al. | ................... | 345/100 |
| 7,079,125 B2* | 7/2006 | Nakagawa et al. | .......... | 345/209 |
| 2002/0050972 A1* | 5/2002 | Udo et al. | ..................... | 345/96 |
| 2003/0170938 A1 | 9/2003 | Takahashi | | |
| 2004/0041826 A1* | 3/2004 | Nakagawa et al. | .......... | 345/694 |
| 2004/0150607 A1* | 8/2004 | Nakajima et al. | ........... | 345/100 |
| 2004/0257389 A1* | 12/2004 | Saito et al. | .................. | 345/690 |

(Continued)

FOREIGN PATENT DOCUMENTS

KR 1020040005514 1/2004

(Continued)

OTHER PUBLICATIONS

Chih-Wen Lu, Member, IEEE, IEEE Journal of Solid-State Circuits, vol. 39, No. 11, Nov. 2004, pp. 1938-1947.

*Primary Examiner*—Nitin Patel
(74) *Attorney, Agent, or Firm*—F. Chau & Associates, LLC

(57) ABSTRACT

An output buffer with an improved output deviation and a source driver of a flat panel display which employs the output buffer wherein the output buffer includes a first input terminal to which a first differential input signal is applied, a second input terminal to which a second differential input signal is applied, an output terminal that generates an output signal based on the second differential input signal and feeds back the output signal to the first input terminal as the first input signal, a first power supply terminal to which a first power supply voltage is applied, a second power supply terminal to which a second power supply voltage is applied, and an amplification unit that amplifies a difference between the first differential input signal and the second differential input signal, pulls up the output signal to the first power supply voltage or pulls down the output signal to the second power supply voltage, and includes a plurality of transistors.

24 Claims, 4 Drawing Sheets

U.S. PATENT DOCUMENTS

| | | | | |
|---|---|---|---|---|
| 2005/0007394 A1* | 1/2005 | Maki | ......................... | 345/690 |
| 2005/0088395 A1* | 4/2005 | Chung | ......................... | 345/98 |
| 2006/0232538 A1* | 10/2006 | Kobashi et al. | ............... | 345/94 |
| 2006/0290635 A1* | 12/2006 | Fratti et al. | .................... | 345/98 |
| 2006/0290636 A1* | 12/2006 | Hong | ......................... | 345/98 |

FOREIGN PATENT DOCUMENTS

| | | |
|---|---|---|
| KR | 1020040090704 | 10/2004 |
| KR | 1020050077049 | 8/2005 |

* cited by examiner

OUTPUT BUFFER WITH IMPROVED OUTPUT DEVIATION AND SOURCE DRIVER FOR FLAT PANEL DISPLAY HAVING THE OUTPUT BUFFER

CROSS-REFERENCE TO RELATED PATENT APPLICATION

This application claims the benefit of Korean Patent Application No. 10-2006-003962, filed on Jan. 13, 2006, in the Korean Intellectual Property Office, the disclosure of which is incorporated herein in its entirety by reference.

BACKGROUND OF THE INVENTION

1. Technical Field

The present disclosure relates to a source driver for a flat panel display and, more particularly, to an output buffer with an improved output deviation and a source driver for a flat panel display having the output buffer.

2. Discussion of Related Art

Typical liquid crystal displays (LCDs) which are comprised of a liquid crystal layer that is disposed between two substrates, adjust the transmissivity of light through the liquid crystal layer by adjusting a voltage applied to the liquid crystal layer and, thus, display a desired image. Examples of such typical LCDs include thin film transistor (TFT)-LCDs using TFTs as switching devices for switching a liquid crystal layer. One of the biggest advantages of polysilicon TFT-LCDs, which are a type of TFT-LCDs is that circuitry consisting of a plurality of MOS transistors formed on a glass substrate can be embedded in polysilicon TFT-LCDs. Currently, a plurality of drivers can be integrated on a glass substrate using a low-temperature polycrystalline silicon (LTPS) process, and an entire system including a controller can be integrated on a glass substrate using a system-on-glass (SOG) method.

TFT-LCDs include a source driver for driving a plurality of liquid crystal cells arranged on a liquid crystal panel. A source driver includes a plurality of output buffers that provide a gray voltage signal to a liquid crystal panel, and each of the output buffers comprises an operational amplifier that is comprised of transistors. In a case where an operational amplifier of a source driver is comprised of transistors, output voltages from the output buffers corresponding to the same input data may have a large deviation. Such deviation is referred to as an offset voltage. An offset voltage varies considerably according to the characteristics of the transistors that produce the offset voltage. Therefore, even if the same data voltage is applied to a source driver, gray voltages applied to a liquid crystal panel in response to the same data voltage may not be identical due to the deviation in output signals from an output buffer of the source driver. When a liquid crystal panel is provided with different gray data for the same input data voltage by a source driver, the liquid crystal panel may malfunction or distort signals, thus deteriorating the quality of images.

A deviation in the output of an output buffer of a source driver is generated due to a deviation in the threshold voltage of a transistor. The threshold voltage of a transistor is a voltage needed to turn on or off the transistor and can be defined as a function of the thickness of a gate insulation layer interposed between a gate electrode and a channel region and the doping concentration of the channel region. The thickness of the gate insulation layer and the doping concentration of the channel region can be altered by process deviations that occur in the manufacturing operation. Conventionally, transistors of an output buffer are manufactured to be identical to one another. Although the gate insulation layers of the transistors are attempted to be formed to have the same thickness this is not always possible during manufacturing, thereby causing a deviation in the output of the output buffer according to the threshold voltage of the transistors.

In order to address this problem, a method involving additionally installing an offset compensation circuit in an output buffer has been suggested. This method, however, increases the size of an output buffer, and this is undesirable.

SUMMARY OF THE INVENTION

Exemplary embodiments of the present invention provide an output buffer with an improved output deviation that comprises a plurality of transistors having different driving capabilities from one another, and that can thus improve an output deviation.

Exemplary embodiments of the present invention also provide a source driver of a flat panel display, which has an output buffer with an improved output deviation.

According to an exemplary embodiment of the present invention, there is provided an output buffer including a first input terminal to which a first differential input signal is applied, a second input terminal to which a second differential input signal is applied, an output terminal that generates an output signal based on the second differential input signal and feeds back the output signal to the first input terminal as the first input signal, a first power supply terminal to which a first power supply voltage is applied, a second power supply terminal to which a second power supply voltage is applied, and an amplification unit that amplifies a difference between the first differential input signal and the second differential input signal, pulls up the output signal to the first power supply voltage or pulls down the output signal to the second power supply voltage, and that includes a plurality of transistors.

The amplification unit may include a plurality of transistors having different driving capabilities.

The plurality of transistors may include a plurality of low voltage transistors, each comprising a thin gate insulation layer, and a plurality of high voltage transistors, each comprising a thick gate insulation layer.

When a power supply voltage of 12 V, for example, is applied to the amplification unit, the low voltage transistors have a driving voltage of 2 V or lower.

The plurality of transistors may include a plurality of MOS transistors formed on a semiconductor substrate or a plurality of thin film transistors (TFTs) formed on a flat display panel substrate.

The first power supply voltage may be a power supply voltage, and the second power supply voltage may be a ground voltage.

The amplification unit may include a signal input unit that receives the first differential input signal and receives the output signal as the second differential input signal, an amplification selection unit that determines an amplification class for the amplification unit, a first current mirror unit that is connected between the first power supply terminal and the signal input unit, a second current mirror unit that is connected between the second power supply terminal and the signal input unit, and an output unit that generates the output signal in accordance with operations of the signal input unit and the amplification selection unit.

Each of the signal input unit, the amplification selection unit, the first and second current mirror units, and the output unit may include a plurality of transistors, wherein the transistors of the first and second current mirror units comprise a plurality of low voltage transistors, each comprising a thin gate insulation layer, and the transistors of the signal input unit, the amplification selection unit, and the output unit comprise a plurality of high voltage transistors, each comprising a thick gate insulation layer.

According to an exemplary embodiment of the present invention, there is provided a source driver of a flat panel display that generates a gray data signal and outputs the gray data signal to a display panel comprised of an array formed of a plurality of display cells. The source driver includes a storage unit that stores a digital data signal provided by an external device, a digital-to-analog (D/A) conversion unit that receives the digital data signal from the storage unit and converts the digital data signal into an analog gray data signal, and an output buffer unit that provides the analog gray data signal to the display panel, wherein the output buffer unit comprises a plurality of output buffers, and each of the output buffers comprises a plurality of transistors having different driving capabilities.

According to an exemplary embodiment of the present invention, there is provided a flat panel display including a display panel that comprises a plurality of gate lines, a plurality of source lines, and an array of a plurality of display cells that are respectively connected to the gate lines and the source lines; a gate driver that generates a plurality of gate driving signals and respectively applies the gate driving signals to the gate lines of the display panel; a source driver that generates an analog gray voltage signal based on a digital input data signal, the analog gray voltage signal being used to drive the display cells of the display panel; and a controller that controls the gate driver and the source driver and applies the digital input data signal to the source driver, wherein the source driver includes a digital-to-analog (D/A) conversion unit that converts the digital input data signal into the analog gray voltage signal, and an output buffer unit that provides the analog gray data signal to the display panel via the source lines, wherein the output buffer unit comprises a plurality of output buffers, and each of the output buffers comprises a plurality of transistors having different driving capabilities.

BRIEF DESCRIPTION OF THE DRAWINGS

Exemplary embodiments of the present invention will be understood in more detail from the following descriptions taken in conjunction with the attached drawings in which.

DETAILED DESCRIPTION OF EXEMPLARY EMBODIMENTS

Figure 1:
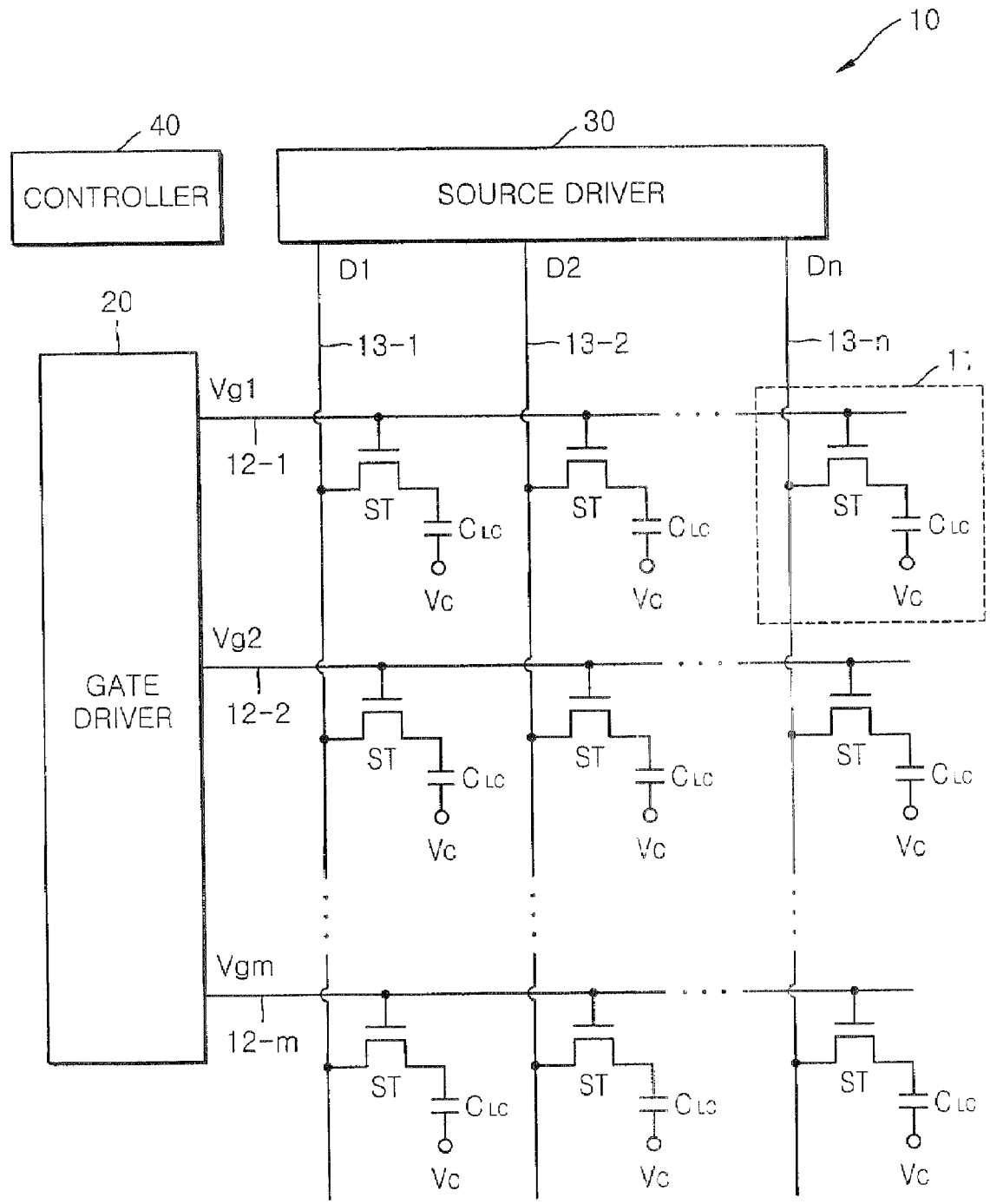
FIG. 1 is a circuit diagram of a thin film transistor (TFT)-liquid crystal display (LCD) according to an exemplary embodiment of the present invention.

Exemplary embodiments of the present invention will now be described more fully with reference to the accompanying drawings in which the exemplary embodiments of the invention are shown. The invention may, however, be embodied in many different forms and should not be construed as being limited to the exemplary embodiments set forth herein, rather, these exemplary embodiments are provided so that this disclosure will be thorough and complete, and will fully convey the concept of the invention to those skilled in the art. Like reference numerals in the drawings represent like elements, and thus their descriptions will be omitted.

FIG. 1 is a circuit diagram of a thin film transistor (TFT)-liquid crystal display (LCD) according to an exemplary embodiment of the present invention. Referring to FIG. 1, the TFT-LCD includes a liquid crystal panel 10 that comprises a liquid crystal cell array, a source driver 30, and a controller 40. More specifically, the liquid crystal panel 10 includes a plurality of gate lines 12-1 through 12-m to which a plurality of gate driving voltages Vg1-Vgm are respectively applied, a plurality of source lines 13-1 through 13-n that respectively cross the gate lines 12-1 through 12-m and to which a plurality of gray voltages D1-Dn are respectively applied, and a plurality of liquid crystal cells 11 that are respectively connected to the gate lines 12-1 through 12-m and the data lines 13-1 through 13-n.

Each of the liquid crystal cells 11 includes a TFT ST that has a gate connected to one of the gate lines 12-1 through 12-m and has a drain connected to one of the source lines 13-1 through 13-n, and a liquid crystal capacitor $C_{LC}$ which has a terminal connected to a source of the TFT ST and a second terminal to which a common voltage $V_C$ is applied. Each of the liquid crystal cells 11 may also include a storage capacitor $C_{st}$ (not shown) that is connected in parallel to the liquid crystal capacitor $C_{LC}$.

The gate driver 20 generates a plurality of gate driving signals that turn on or off the gates of the TFTs ST of the liquid crystal cells 11, that is, the gate driving voltages Vg1 through Vgm, and respectively apply the gate driving voltages Vg1 through Vgm to the gate lines 12-1 through 12-m. The source driver 30 respectively applies the gray voltages D1 through Dn in response to input data to the source lines 13-1 through 13-n. The controller 40 receives a control signal provided by an external device (not shown) and generates a driver control signal (not shown) used to drive the gate driver 20 and the source driver 30 based on the received control signal.

The gate driver 20 and the source driver 30 may be located outside the liquid crystal panel 10. Alternatively, if the TFT-LCD is of a chip-on-glass (COG) type, the gate driver 20 and the source driver 30 may be located on the liquid crystal panel 1. The gate driver 20 and the source driver 30 may be formed on a glass substrate during the formation of the cell array of the liquid crystal panel 10. The controller 40 may be located outside the liquid crystal panel 10. Alternatively, if the TFT-LCD is of a system-on-glass (SOG) type, the controller 40 may be located on the liquid crystal panel 10.

Figure 2:
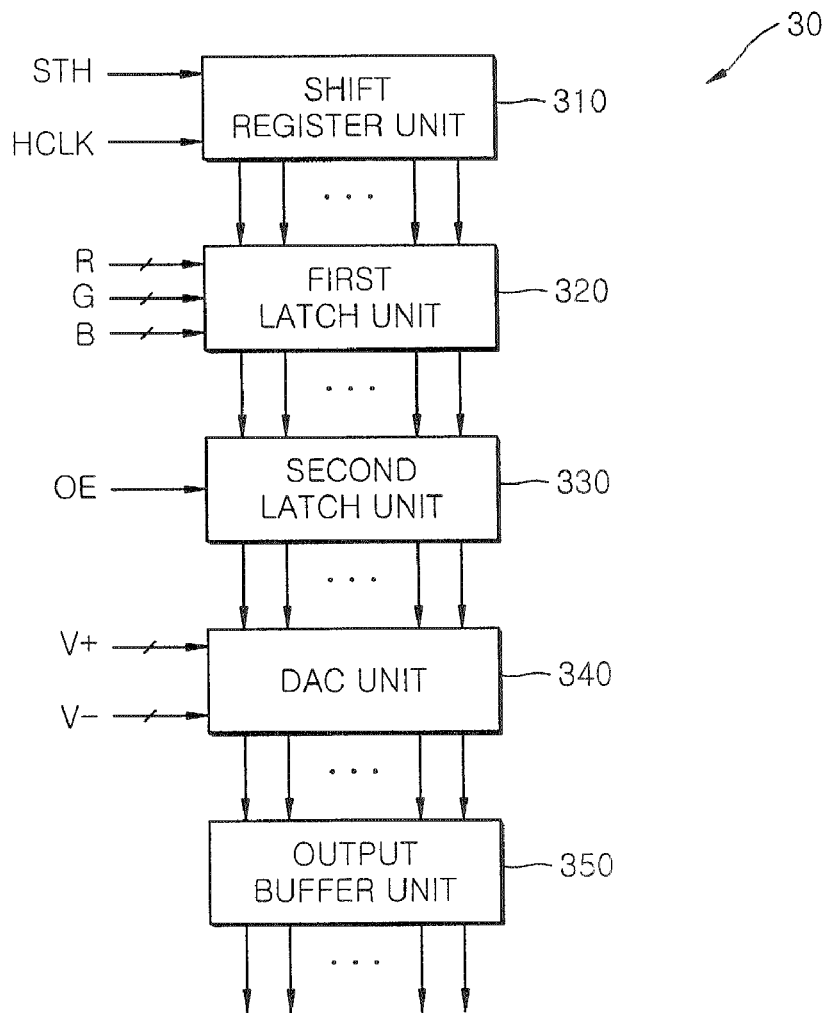
FIG. 2 is a block diagram of a source driver of a TFT-LCD according to an exemplary embodiment of the present invention.

FIG. 2 is a block diagram of the source driver 30 illustrated in FIG. 1 according to an exemplary embodiment of the present invention. Referring to FIG. 2, the source driver 30 includes a shift register unit 310, a first latch unit 320, a second latch unit 330, a digital-to-analog (D/A) conversion unit 340, and an output buffer unit 350. The shift register unit 310 receives a data clock signal HCLK and a horizontal synchronization start signal STH from the controller 40 shown in FIG. 1. The shift register unit 310 shifts the horizontal synchronization start signal STH a number of times in series, and outputs the results of the shifting to the first latch unit 320.

The first latch unit 320 sequentially receives and latches a plurality of data signals, each comprised of a predetermined number of bits, for example, R, G, and B data signals, each comprised of eight bits, from the controller 40 in response to an output signal of the shift register unit 310. The H, G, and B data signals are digital signals, each having a predetermined gray scale value. When all the R, G, and B data signals, which are to be output to the source lines 13-1 through 13-n illustrated in FIG. 1, are stored in the first latch unit 320, they are simultaneously output to the second latch unit 330

The R, G, and B data signals stored in the second latch unit 330 are output to the D/A conversion unit 340 in response to an output enable signal OE. The D/A conversion unit 340 chooses one of a plurality of gray voltages, for example, V+ through V−, generated by a gray voltage generation unit (not shown) in accordance with the R, G, and B data signals provided by the second latch unit 330 and outputs the chosen gray voltage. In other words, the D/A conversion unit 340 receives the R, G, and B data signals, which are digital signals, from the second latch unit 330 and converts them into a gray voltage signal, which is an analog signal. The D/A conversion unit 340 may comprise a plurality of D/A converters, for example, n D/A converters (not shown). In this case, the n D/A converters respectively provide analog gray voltage signals DAC1 through DACn to the output buffer unit 350.

The source driver 30 may also include a level shifter unit (not shown) that is disposed between the second latch unit 330 and the D/A conversion unit 340. The level shifter unit converts the R, G, and B data signals stored in the second latch unit 330 into R, G, and B data signals having a high enough voltage to drive the liquid crystal panel 10.

Figure 3:
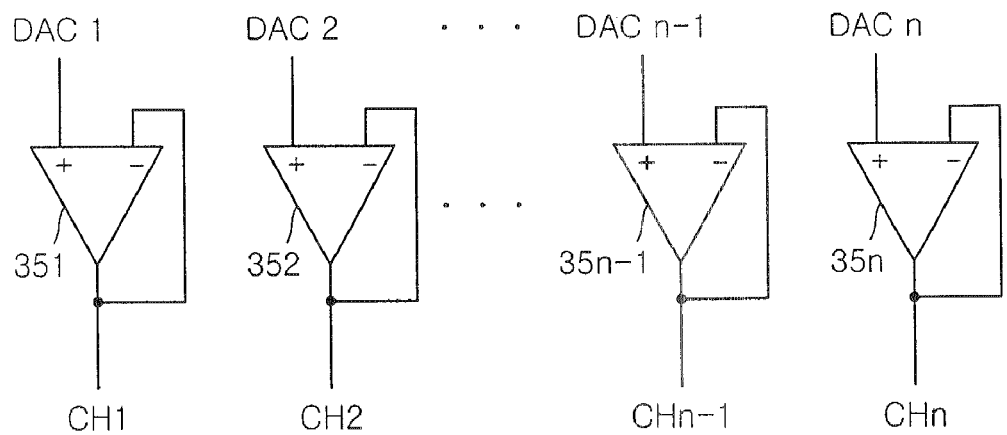
FIG. 3 is a circuit diagram of an output buffer unit of a source driver of a TFT-LCD according to an exemplary embodiment of the present invention.

The output buffer unit 350 provides an output signal from the D/A conversion unit 340 to the liquid crystal panel 10 via the source lines 13-1 through 13-n. Referring to FIG. 3., the output buffer unit 350 includes a plurality of output buffers, for example, n output buffers 351 through 35n, that respectively provide the gray voltage signals DAC1 through DACn generated by the D/A converters of the D/A conversion unit 340 to the source lines 13-1 through 13-n.

Each of the output buffers 351 through 35n is comprised of a differential amplifier that has a non-inverted input terminal (+) to which one of the gray voltage signals DAC0 through DACn is provided, and an inverted input terminal (−) to which one of a plurality of output signals CH1 through CHn is fed back. The output buffers 351 through 35n respectively amplify the gray voltage signals DAC1 through DACn and provide the results of the amplifications, that is, the output signals CH1 through CHn, to the liquid crystal panel 10 via the source lines 13-1 through 13-n.

Figure 4:
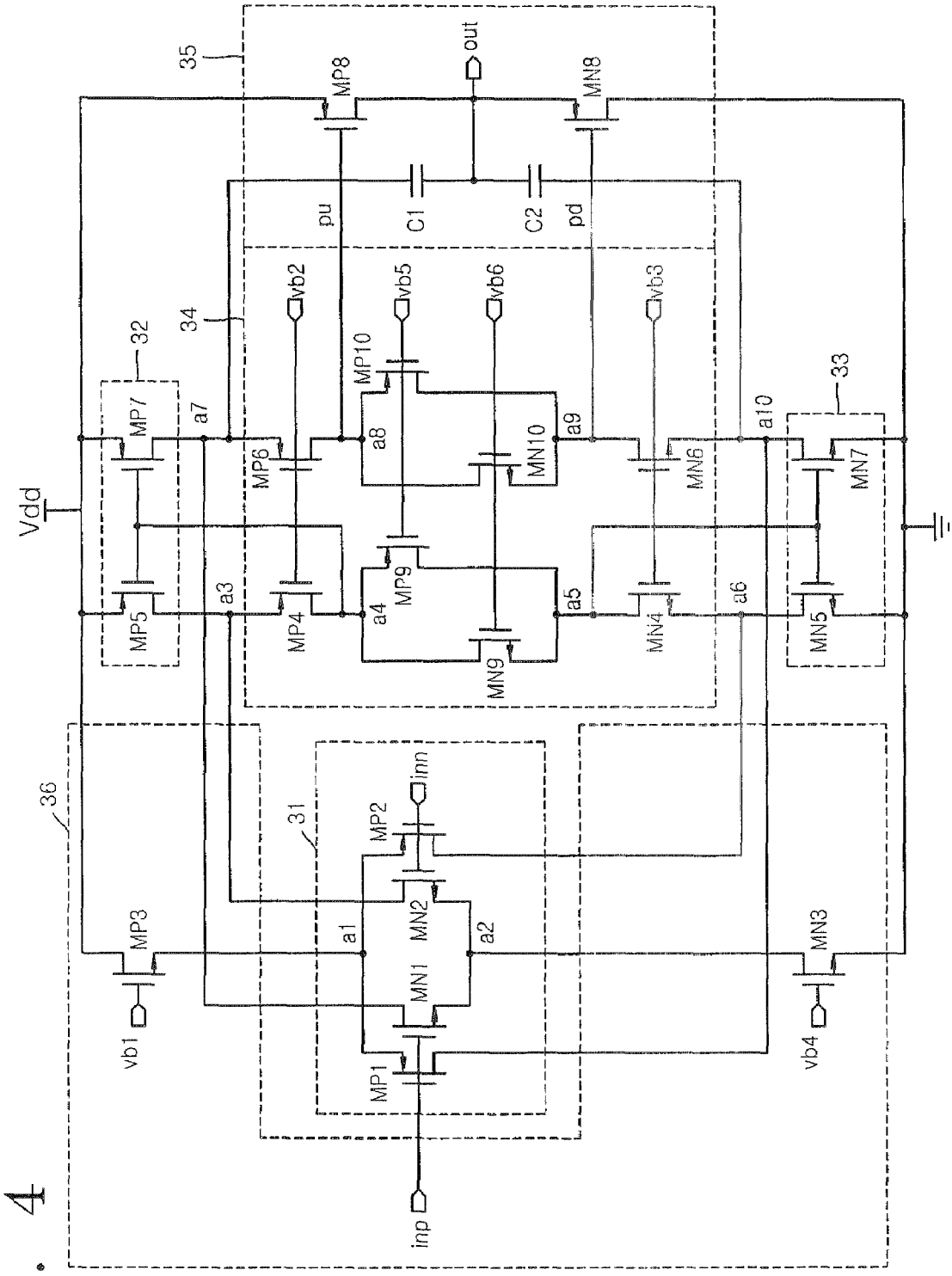
FIG. 4 is a detailed circuit diagram of an output buffer of a source driver of a TFT-LCD according to an exemplary embodiment of the present invention.

FIG. 4 is a detailed circuit diagram of one of the output buffers 351 through 35n illustrated in FIG. 3 according to an exemplary embodiment of the present invention. The output buffers 351 through 35n all have the same structure. Referring to FIG. 4, each of the output buffers 351 through 35n includes a differential amplification unit, an amplification selection unit 34, an output unit 35, and an enabling unit 36. The differential amplification unit includes a signal input unit 31, a first current mirror unit 32, and a second current mirror unit 33. The signal input unit 31 receives one of the gray voltage signals DAC0 through DACn provided by the D/A conversion unit 340 via a first differential input terminal as a first differential input signal inp and receives one of the output signals CH1 through CHn from an output terminal out via a second differential input terminal as a second differential input signal inn. The first differential input terminal corresponds to the non-inverted input terminal (+) illustrated in FIG. 3, and the second differential input terminal corresponds to the inverted input terminal (−) illustrated in FIG. 3.

The signal input unit 31 includes first and second NMOS transistors MN1 and MN2 that receive the first differential input signal inp and the second differential input signal inn, respectively, and first and second PMOS transistors MP1 and MP2 that receive the first differential input signal inp and the second differential input signal inn, respectively. The first and second differential input signals inp and inn are respectively applied to the gates of the first and second NMOS transistors MN1 and MN2, the sources of the first and second NMOS transistors MN1 and MN2 are commonly connected to a second node a2, and the drains of the first and second NMOS transistors MN1 and MN2 are respectively connected to a seventh node a7 and a third node a3. The second differential input signal inn is applied to the gates of the first and second PMOS transistors MP1 and MP2, the sources of the first and second PMOS transistors MP1 and MP2 are commonly connected to a first node a1, and the drains of the first and second PMOS transistors MP1 and MP2 are respectively connected to a tenth node a10 and a sixth node a6.

The first current mirror unit 32 includes fifth and seventh PMOS transistors MP5 and MP7. The gates of the fifth and seventh PMOS transistors MP5 and MP7 are commonly connected to a fourth node a4, the sources of the fifth and seventh PMOS transistors MP5 and MP7 are connected to a first power supply terminal, and the drains of the fifth and seventh PMOS transistors MP5 and MP7 are respectively connected to the third node a3 and the seventh node a7. A power supply voltage Vdd is provided to the first power supply terminal.

The second current mirror unit 33 includes fifth and seventh NMOS transistors MN5 and MN7. The gates of the fifth and seventh NMOS transistors MN5 and MN7 are commonly connected to a fifth node a5, the sources of the fifth and seventh NMOS transistors MN5 and MN7 are connected to a second power supply terminal, and the drains of the fifth and seventh NMOS transistors MN5 and MN7 are respectively connected to the sixth node a6 and the tenth node a10. A ground voltage is provided to the second power supply terminal.

When the output buffer amplifies one of the gray voltage signals DCA0 through DCAn provided by the D/A conversion unit 340, the amplification selection unit 34 determines an amplification class for the differential amplification unit. For example, the amplification selection unit 34 chooses one of amplification class A, amplification class B, and amplification class AB according to fifth and sixth bias voltages vb5 and vb6 provided by an external circuit (not shown) and allows the differential amplification unit to amplify the first and second differential input signals inp and inn according to the chosen amplification class. The amplification selection unit 34 includes fourth, sixth, ninth, and tenth PMOS transistors MP4, MP6, MP9, and MP10 and fourth sixths ninth, and tenth NMOS transistors MN4, MN6, MN9, and MN10.

A second bias voltage vb2 is applied to the gates of the fourth and sixth PMOS transistors MP4 and MP6, the sources of the fourth and sixth PMOS transistors MP4 and MPG are respectively connected to the third node a3 and the seventh node a7, and the drains of the fourth and sixth PMOS transistors MP4 and MP6 are respectively connected to the fourth node a4 and an eighth node a8. A third bias voltage vb3 is applied to the gates of the fourth and sixth NMOS transistors MN4 and MN6, the sources of the fourth and sixth NMOS transistors MN4 and MN6 are respectively connected to the sixth node a6 and the tenth node a10, and the drains of the fourth and sixth NMOS transistors MN4 and MN6 are respectively connected to the fifth node a5 and a ninth node a9. The fifth bias voltage vb5 is applied to the gates of the ninth and tenth PMOS transistors MP9 and MP10, the sources of the ninth and tenth PMOS transistors MP9 and MP10 are respectively connected to the fourth node a4 and the eighth node a8, and the drains of the ninth and tenth PMOS transistors MP9 and MP10 are respectively connected to the fifth node a5 and the ninth node a9. The sixth bias voltage vb6 is applied to the gates of the ninth and tenth NMOS transistors MN9 and MN10, the sources of the ninth and tenth NMOS transistors MN9 and MN10 are respectively connected to the fifth node a5 and the ninth node a9, and the drains of the ninth and tenth NMOS transistors MN9 and MN10 are respectively connected to the fourth node a4 and the eighth node a8.

The output unit 35 includes an eighth PMOS transistor MP8, an eighth NMOS transistor MN8, and first and second capacitors C1 and C2. The gate of the eighth PMOS transistor MP8 and the gate of the eighth NMOS transistor MN8 are respectively connected to the eighth node a8 and the ninth node a9, the source of the eighth PMOS transistor MP8 and the source of the eighth NMOS transistor MN8 are respectively connected to the first power supply terminal and the second power supply terminal, and the drain of the eighth PMOS transistor MP8 and the drain of the eighth NMOS transistor MN8 are commonly connected to the output terminal out. A pull-up signal pu is applied to the gate of the eighth PMOS transistor MP8 via the eighth node a8, and a pull-down signal pd is applied to the gate of the eighth NMOS transistor MN8 via the ninth node a9. A first terminal of the first capacitor C1 is connected to the seventh node a7, and a first terminal of the second capacitor C2 is connected to the tenth node a10. A second terminal of the first capacitor C1 and a second terminal of the second capacitor C2 are commonly connected to the output terminal out.

The enabling unit 36 enables the signal input unit 31 of the differential amplification unit and includes a third PMOS transistor MP3 and a third NMOS transistor MN3. A first bias voltage vb1 and a fourth bias voltage vb4 are respectively applied to the gate of the third PMOS transistor MP3 and the gate of the third NMOS transistor MN3, the source of the third PMOS transistor MP3 and the source of the third NMOS transistor MN3 are respectively connected to the first power supply terminal and the second power supply terminal, and the drain of the third PMOS transistor MP3 and the drain of the third NMOS transistor MN3 are respectively connected to the first node a1 and the second node a2. The first through sixth bias voltages vb1 through vb6 are constant voltages provided by an external device (not shown).

The output buffer receives the first differential input signal inp and the second differential input signal inn and respectively activates the third PMOS transistor MP3 and the third NMOS transistor MN3 using the first bias voltage vb1 and the fourth bias voltage vb4. The differential amplification unit amplifies a difference between the first differential input signal inp and the second differential input signal inn, and provides the result of the amplification to the seventh node a7 and the tenth node a10. The amplification selection unit 34 determines an amplification class for the differential amplification unit based on the fifth bias voltage vb5 and the sixth bias voltage vb6 respectively applied to the tenth PMOS transistor MP10 and the tenth NMOS transistor MN10. Also, the amplification selection unit 34 transmits the pull-up signal pu and the pull-down signal pd to the output unit 35. The eighth PMOS transistor MP8 and the eighth NMOS transistor MN8 of the output unit 35 are driven in response to the pull-up signal pu and the pull-down signal pd., respectively, and thus generate the output signals CH1 through CHn of FIG. 3 through the output terminal out.

If the source driver 30 drives the liquid crystal panel 10 using an inversion driving method, for example, a dot inversion driving method, the D/A conversion unit 340 may provide a plurality of positive gray voltage signals and a plurality of negative gray voltage signals to the output buffer unit 350 of FIG. 2 as the gray voltage signals DAC1 through DACn. In this case., the source driver 30 of FIG. 1 may also include a polarity inversion control unit (not shown) that controls the positive gray voltage signals or the negative gray voltage signals to be respectively provided to the output buffers 351 through 35n of the output buffer unit 350 as the gray voltage signals DAC1 through DACn.

The output signals 'out' of the output buffers 351 through 35n may have a deviation (hereinafter referred to as an output deviation) due to irregularities in threshold voltages Vth of the MOS transistors MP1 through MP10 and MN1 through MN10 constituting each of the output buffers 351 through 35n. A deviation $S(\Delta Vth)$ in the threshold voltages Vth may be indicated by Equation (1) below:

$$S(\Delta Vth) = \frac{Avt}{\sqrt{W \times L}} = \frac{q \times \sqrt{Nt}}{Cox \times \sqrt{W \times L}}$$

where Nt represents the doping concentration of channel regions of a plurality of MOS transistors, Cox represents the capacitance of gate insulation layers of the MOS transistors, W and L respectively represent the width and length of the MOS transistors, and q indicates the amount of electric charge in the MOS transistors.

As indicated by Equation (1), if a plurality of MOS transistors of an output buffer have the same width and length and have the same channel region doping concentration, a deviation $S(\Delta Vth)$ in threshold voltages Vth of the MOS transistors varies according to the thickness of gate insulation layers of the MOS transistors. More specifically, the thicker the gate insulation layers, the greater the threshold voltage deviation $S(\Delta Vth)$.

The voltages of the first through tenth nodes a1 through a10 respectively corresponding to the MOS transistors of each of the output buffers 351 through 35n are presented in Table 1 set forth below. Table 1 presents the voltages of the first through tenth nodes a1 through a10 when the power supply voltage Vdd is 12 V and an input voltage Vin, that is, the voltage of the first differential input signal inp, is 0.2 V, 4 V, 11.8 V, or 8 V. Of the MOS transistors MP1 through MP10 and MN1 through MN10, those that have low driving voltages affect an output deviation δ more considerably than those that have high driving voltages. For example, referring to the MOS transistors MP1 through MP10 and MN1 through MN10, those that have a driving voltage of 2 V or lower, against the power supply voltage of 12 V and the ground voltage of 0 V, may considerably affect the output deviation δ when the power supply voltage Vdd is 12 V. Referring to Table 1, the third, sixth, seventh, and tenth nodes a3, a6, a7 and a10 maintain a driving voltage of 2 V or lower regardless of the input voltage Vin. The fifth and seventh PMOS transistors MP5 and MP7, which are included in the first current mirror unit 32 and are respectively connected to the third node a3 and the seventh node a7 have the low driving voltage of 2 V or lower against the power voltage Vdd of 12 V. Whereas the nodes a6 and a10 maintain the low driving voltage of 2 V or lower against the ground voltage and the fifth and seventh NMOS transistors MN5 and MN7, which are included in the second current mirror unit 33 respectively connected to the sixth node a6 and the tenth node a10, have a driving voltage of 2 V or lower against the ground voltage of 0 V. However, the nodes of a5 and a9 do maintain the low driving voltage of 2 V or lower against the power supply voltage and the ground voltage.

In order to reduce the output deviation δ, gate insulation layers of the fifth and seventh PMOS transistors MP5 and MP7 and the fifth and seventh NMOS transistors MN5 and MN7 may be formed thinner than gate insulation layers of the other MOS transistors.

Figure 5:
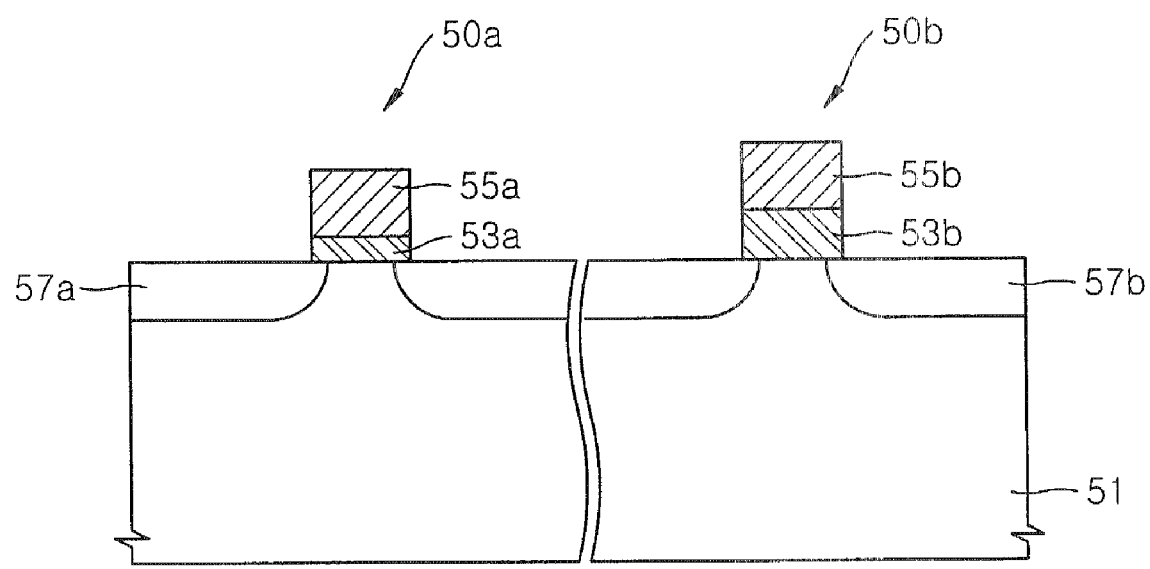
FIG. 5 is a cross-sectional view of the output buffer illustrated in FIG. 4 according to an exemplary embodiment of the present invention.

Therefore, the fifth and seventh PMOS transistors MP5 and MP7 and the fifth and seventh NMOS transistors MN5 and MN7 which have low driving voltages may be formed as low voltage transistors 50a having a thin gate insulation layer, and the other MOS transistors may be formed as high voltage transistors 50b having a thick gate insulation layer, as illustrated in FIG. 5. The low voltage transistors 50a and the high voltage transistors 50b will now be described in further detail with reference to FIG. 5.

TABLE 1

| Nodes | Vin | | | |
|---|---|---|---|---|
| | 0.2 V | 4 V | 11.8 V | 8 V |
| a1 | 3.95 | 6.91 | 12.00 | 9.93 |
| a2 | 0 | 1.95 | 7.63 | 4.80 |
| a3 | 10.98 | 10.95 | 10.95 | 10.95 |
| a4 | 10.59 | 10.54 | 10.53 | 10.54 |
| a5 | 1.53 | 1.46 | 1.36 | 1.46 |
| a6 | 0.45 | 0.47 | 0.47 | 0.47 |
| a7 | 11.11 | 11.06 | 11.04 | 11.06 |
| a8 | 11.05 | 11.00 | 10.97 | 10.99 |
| a9 | 1.11 | 1.12 | 1.03 | 1.08 |
| a10 | 0.45 | 0.47 | 0.47 | 0.47 |

Referring to FIG. 5, a low voltage transistor 50a includes a gate insulation layer 53a that is thinly formed on a substrate 51, a gate electrode 55a, and a source/drain region 57a. A high voltage transistor 50b includes a gate insulation layer 53b that is more thickly formed on the substrate 51, a gate electrode 55b, and a source/drain region 57b. The thickness of the gate insulation layer 53a is less than the thickness of the gate insulation layer 53b. The MOS transistors MP1 through MP10 and MN1 through MN10 of each of the output buffers 351 through 35n are not limited to the structure illustrated in FIG. 5 but can have various structures.

In a case where the source driver 30 of FIG. 1 is integrated with the cell array of the liquid crystal panel 10, a substrate, such as a glass substrate, a plastic substrate, or a metallic substrate, which is widely used in the manufacture of flat panel display panels may be used as the substrate 51, and the low voltage transistor 50a and the high voltage transistor 50b may be formed as N-type or P-type TFTs by using for example, a low temperature polysilicon process. On the other hand, in a case where the source driver 30 is not integrated with the cell array of the liquid crystal panel 10, the substrate 51 may be comprised of a semiconductor substrate such as a silicon substrate, which is widely used in the manufacture of semiconductor integrated circuits, and the low voltage transistor 50a and the high voltage transistor 50b may be formed as typical MOS transistors.

According to the exemplary embodiment of the present invention, those MOS transistors MP1 through MP10 and MN1 through MN10 that are formed as low voltage MOS transistors have a driving voltage of 2 V or lower when the power supply voltage Vdd is 12 V, but the present invention is not restricted thereto.

As described above, according to exemplary embodiments of the present invention of a plurality of transistors of an output buffer of a source driver of a flat panel display, those that considerably affect an output deviation are formed as low voltage transistors including a thin gate insulation layer, and the rest of the plurality of transistors are formed as high voltage transistors including a thick gate insulation layer. Therefore, it is possible to improve an output deviation of the output buffer, which is generated due to variations in threshold voltages of the plurality of transistors without increasing the chip area of the output buffer. In addition the output buffer comprised of a plurality of transistors having different driving capabilities can be applied to drivers of various flat panel displays.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. An output buffer comprising:
    a first input terminal to which a first differential input signal is applied;
    a second input terminal to which a second differential input signal is applied;
    an output terminal at which an output signal based on the second differential input signal is generated and that feeds back the output signal to the first input terminal as the first input signal;
    a first power supply terminal to which a first power supply voltage is applied;
    a second power supply terminal to which a second power supply voltage is applied; and
    an amplification unit that amplifies a difference between the first differential input signal and the second differential input signal, that pulls up the output signal to the first power supply voltage or pulls down the output signal to the second power supply voltage, and that includes a plurality of transistors.

2. The output buffer of claim 1, wherein the amplification unit comprises a plurality of transistors having different driving capabilities.

3. The output buffer of claim 2, wherein the plurality of transistors comprise a plurality of low voltage transistors, each comprising a thin gate insulation layer, and a plurality of high voltage transistors, each comprising a thick gate insulation layer.

4. The output buffer of claim 3, wherein, when a power supply voltage of 12 V is applied to the amplification unit, the plurality of low voltage transistors have a driving voltage of 2 V or lower.

5. The output buffer of claim 1, wherein the plurality of transistors comprise one of a plurality of MOS transistors formed on a semiconductor substrate and a plurality of thin film transistors (TFTs) formed on a flat display panel substrate.

6. The output buffer of claim 1, wherein the first power supply voltage is a predetermined power supply voltage, and the second power supply voltage is a ground voltage.

7. The output buffer of claim 1, wherein the amplification unit comprises:
    a signal input unit that receives the first differential input signal and that receives the output signal as the second differential input signal;
    an amplification selection unit that determines an amplification class for the amplification unit;
    a first current mirror unit connected between the first power supply terminal and the signal input unit;

a second current mirror unit connected between the second power supply terminal and the signal input unit; and an output unit that generates the output signal in accordance with operations of the signal input unit and the amplification selection unit.

8. The output buffer of claim 7, wherein the signal input unit, the amplification selection unit, the first and second current mirror units, and the output unit each comprise a plurality of transistors, wherein the transistors of the first and second current mirror units include a plurality of low voltage transistors, each having a thin gate insulation layer, and the transistors of the signal input unit, the amplification selection unit, and the output unit include a plurality of high voltage transistors, each having a thick gate insulation layer.

9. A source driver of a flat panel display that generates a gray data signal and outputs the gray data signal to a display panel formed of an array of a plurality of display cells, the source driver comprising:
a storage unit that stores a digital data signal provided by an external device;
a digital-to-analog (D/A) conversion unit that receives the digital data signal from the storage unit and converts the digital data signal into an analog gray data signal; and
an output buffer unit that provides the analog gray data signal to the display panel,
wherein the output buffer unit includes a plurality of output buffers, and each of the output buffers includes a plurality of transistors having different driving capabilities.

10. The source driver of claim 9, wherein the plurality of transistors comprise a plurality of low voltage transistors, each having a thin gate insulation layer, and a plurality of high voltage transistors, each having a thick gate insulation layer.

11. The source driver of claim 10, wherein, when a power supply voltage of 12 V is applied to the output buffer unit, the low voltage transistors have a driving voltage of 2 V or lower.

12. The source driver of claim 9, wherein each of the output buffers comprises:
a signal input unit that receives a first differential input signal and that receives the gray data signal as a second differential input signal;
an amplification selection unit that determines an amplification class for the corresponding output buffer;
a first current mirror unit connected between the first power supply terminal and the signal input unit;
a second current mirror unit connected between the second power supply terminal and the signal input unit; and
an output unit that generates the gray data signal in accordance with operations of the signal input unit and the amplification selection unit.

13. The source driver of claim 12, wherein the signal input unit, the amplification selection unit, the first and second current mirror units, and the output unit each comprise a plurality of transistors, wherein the transistors of the first and second current mirror units include a plurality of low voltage transistors, each having a thin gate insulation layer, and the transistors of the signal input unit, the amplification selection unit, and the output unit include a plurality of high voltage transistors, each having a thick gate insulation layer.

14. The source driver of claim 9, wherein the display panel is a liquid crystal panel.

15. The source driver of claim 9, wherein the plurality of transistors comprise one of a plurality of MOS transistors formed on a semiconductor substrate and a plurality of thin film transistors (TFTs) formed on a flat display panel substrate.

16. The source driver of claim 9, wherein the flat panel display is of a system-on-glass (SOG) type.

17. A flat panel display comprising:
a display panel that includes a plurality of gate lines, a plurality of source lines, and an array of a plurality of display cells that are respectively connected to the plurality of gate lines and the plurality of source lines;
a gate driver that generates a plurality of gate driving signals and respectively applies the plurality of gate driving signals to the plurality of gate lines of the display panel;
a source driver that generates an analog gray voltage signal based on a digital input data signal, the analog gray voltage signal being used to drive the array of display cells of the display panel; and
a controller that controls the gate driver and the source driver and applies the digital input data signal to the source driver,
wherein the source driver includes:
a digital-to-analog (D/A) conversion unit that converts the digital input data signal into the analog gray voltage signal; and
an output buffer unit that provides the analog gray data signal to the display panel via the plurality of source lines, wherein the output buffer unit includes a plurality of output buffers, and each of the plurality output buffers includes a plurality of transistors having different driving capabilities.

18. The flat panel display of claim 17, wherein the plurality of transistors comprise a plurality of low voltage transistors having low driving voltages, and a plurality of high voltage transistors having high driving voltages.

19. The flat panel display of claim 18, wherein, when a power supply voltage of 12 V is applied to the amplification unit, the low voltage transistors have a driving voltage of 2 V or lower.

20. The flat panel display of claim 17, wherein the display panel is a liquid crystal panel.

21. The flat panel display of claim 17, wherein the plurality of transistors comprise one of a plurality of MOS transistors formed on a semiconductor substrate and a plurality of thin film transistors (TFTs) formed on a flat display panel substrate.

22. The flat panel display of claim 17 being of a system-on-glass (SOG) type.

23. The flat panel display of claim 17, wherein each of the plurality of output buffers comprises:
a signal input unit that receives a first differential input signal and that receives the gray voltage signal as a second differential input signal;
an amplification selection unit that determines an amplification class for the corresponding output buffer;
a first current mirror unit connected between a first power supply terminal and the signal input unit;
a second current mirror unit connected between a second power supply terminal and the signal input unit; and
an output unit that generates the analog gray data signal in accordance with operations of the signal input unit and the amplification selection unit.

24. The flat panel display of claim 23, wherein the signal input unit, the amplification selection unit, the first and second current mirror units, and the output unit each comprise a plurality of transistors, wherein the plurality of transistors of the first and second current mirror units include a plurality of low voltage transistors, each having a thin gate insulation layer, and the transistors of the signal input unit, the amplification selection unit, and the output unit include a plurality of high voltage transistors, each having a thick gate insulation layer.

* * * * *